US008928219B2

(12) United States Patent
Chan et al.

(10) Patent No.: US 8,928,219 B2
(45) Date of Patent: Jan. 6, 2015

(54) LIGHTING DEVICE WITH SPECTRAL CONVERTER

(71) Applicant: Avago Technologies General IP (Singapore) Pte. Ltd., Singapore (SG)

(72) Inventors: Chuan Hoe Chan, Perak (MY); Kwok Yuen Ng, Penang (MY); Kum Soon Wong, KL (MY); Kheng Leng Tan, Penang (MY); Ju Chin Poh, Penang (MY); Keat Chuan Ng, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/785,895

(22) Filed: Mar. 5, 2013

(65) Prior Publication Data
US 2014/0252943 A1 Sep. 11, 2014

(51) Int. Cl.
*H01L 51/50* (2006.01)
*H05B 33/12* (2006.01)

(52) U.S. Cl.
CPC .................................... *H05B 33/12* (2013.01)
USPC .......................................... 313/498; 313/500

(58) Field of Classification Search
CPC ......................... H01I 25/0657; H01I 25/0753
USPC .......................................... 313/498, 500, 502
See application file for complete search history.

(56) References Cited

U.S. PATENT DOCUMENTS

| 6,833,565 | B2 | 12/2004 | Su et al. |
| 7,206,507 | B2 * | 4/2007 | Lee et al. ....................... 396/182 |
| 7,576,478 | B2 | 8/2009 | Hikmet |
| 8,232,117 | B2 | 7/2012 | Basin et al. |
| 8,338,838 | B2 | 12/2012 | Sun et al. |
| 2007/0291494 | A1 | 12/2007 | Galli |
| 2008/0173884 | A1 | 7/2008 | Chitnis et al. |
| 2009/0093075 | A1 | 4/2009 | Chu et al. |
| 2009/0173958 | A1 | 7/2009 | Chakraborty et al. |
| 2009/0173960 | A1 | 7/2009 | Martin et al. |
| 2009/0179207 | A1 | 7/2009 | Chitnis et al. |
| 2011/0031516 | A1 | 2/2011 | Basin et al. |
| 2012/0187427 | A1 | 7/2012 | Chandra |

OTHER PUBLICATIONS

Allen, Steven C. et al., "ELiXIR—Solid-State Luminaire With Enhanced Light Extraction by Internal Reflection", http://www.opticsinfobase.org/jdt/abstract.cfm?id-138243>, vol. 3, Issue 2 2007, 155-159.

(Continued)

*Primary Examiner* — Mary Ellen Bowman

(57) ABSTRACT

In one embodiment, a light-emitting device having a body, a reflector, a light source die, and a spectral converter is disclosed. The spectral converter may be formed adjacent to, but distanced away from, the light source die. The spectral converter may be configured to spectrally adjust a portion of the light output having a predetermined spectral content. In another embodiment, a system for illumination having a plurality of lighting assemblies is disclosed. Each of the lighting assemblies comprises a spectral converter configured to spectrally adjust a portion of the light output so that the plurality of lighting assemblies are configured to emit substantially similar spectral output. In yet another embodiment, a lighting apparatus having the spectral converter is disclosed.

20 Claims, 14 Drawing Sheets

(56) References Cited

OTHER PUBLICATIONS

Oh, Jeong R. et al., "Enhanced Forward Efficiency of $Y_3Al_5O_{12}:Ce^{3+}$ Phosphor From White Light-Emitting Diodes Using Blue-Pass Yellow-Reflection Filter", http://pbg.kaist.ac.kr/src_paper/2009OpE__Cho.pdf>, vol. 17, Issue 9 Apr. 21, 2009, 7450-7457.

Su, Jung-Chieh et al., "Design and Fabrication of White Light Emitting Diodes With an Omnidirectional Reflector", http://www.opticsinfobase.org/ao/abstract.cfm?uri=ao-48-26-4942>, vol. 48, Issue 26 2009, 4942-4946.

Taguchi, Tsunemasa, "Recent Progress and Future Prospect of High-Performance Near-UV Based White LEDs—From ECO Lighting to Medical Application", http://144.206.159.178/ft/CONF/16435683/16435690.pdf>, vol. 7422 2009.

\* cited by examiner

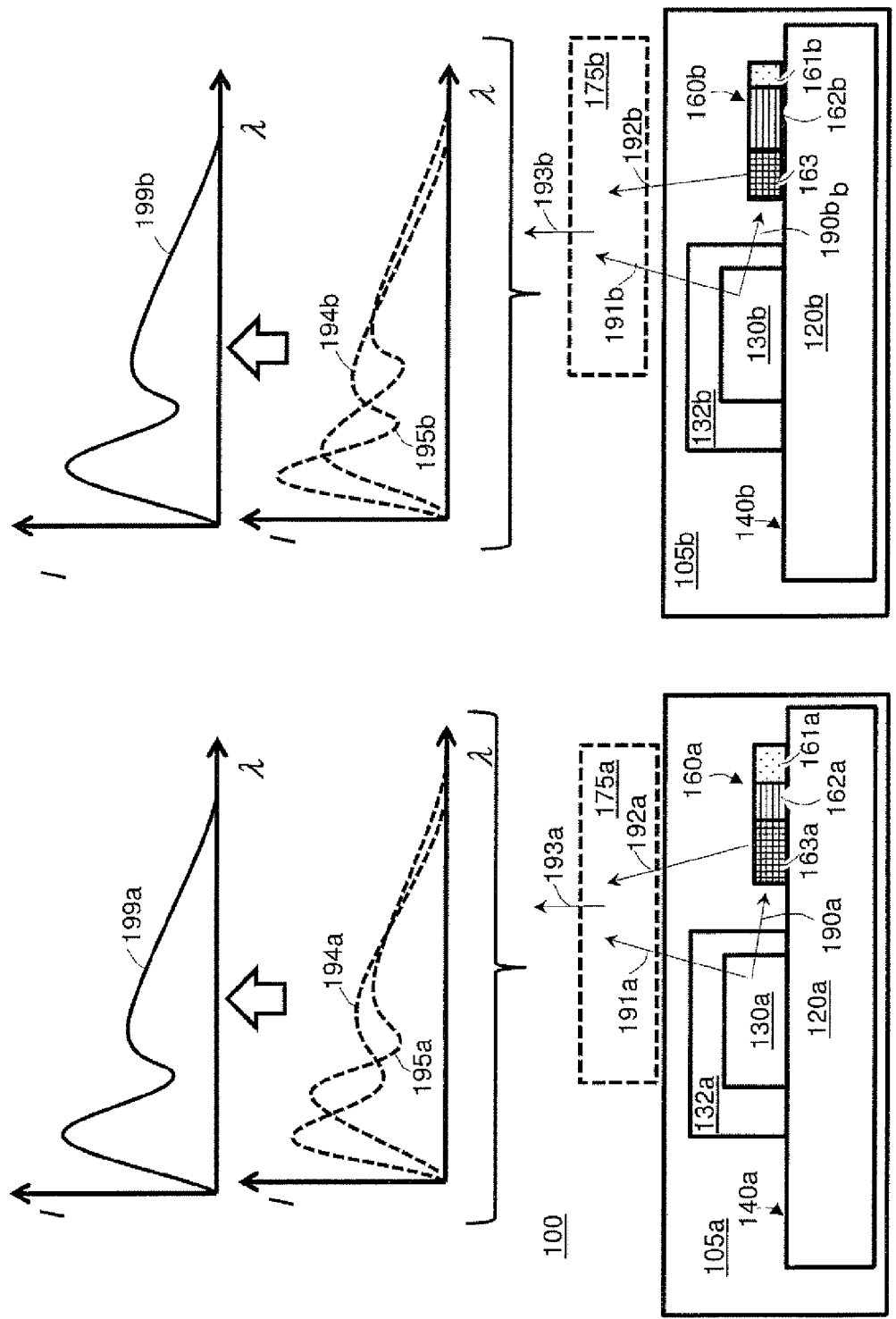

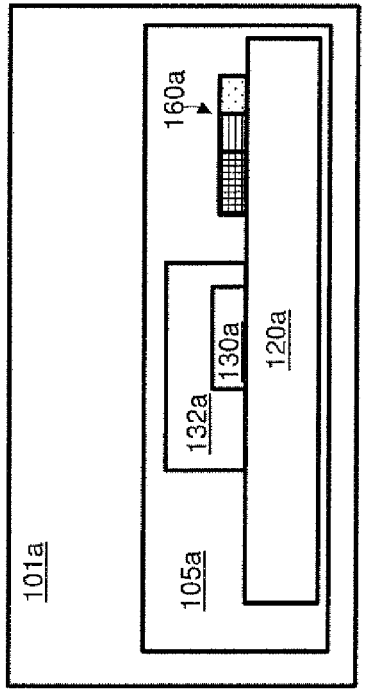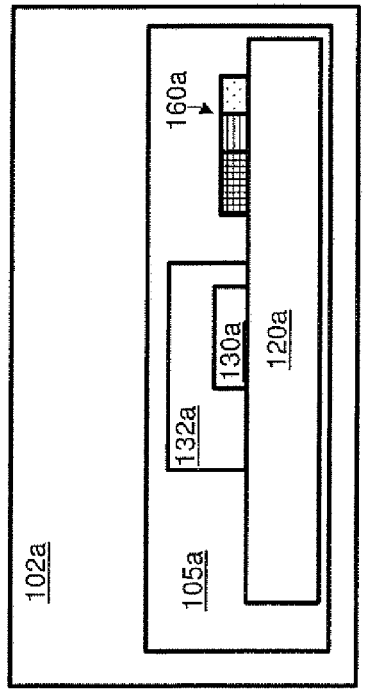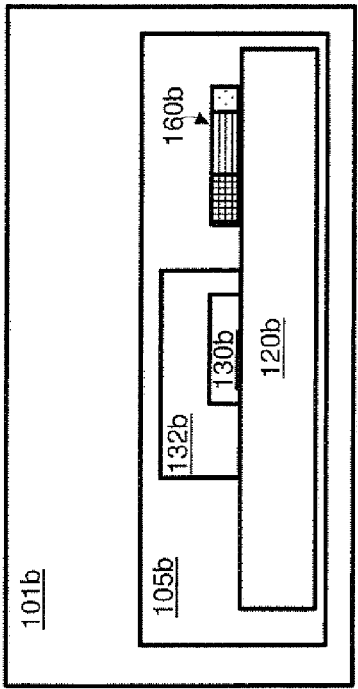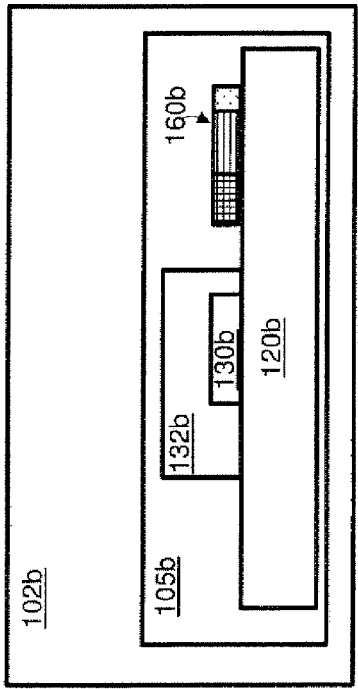
FIG. 1D
FIG. 1E

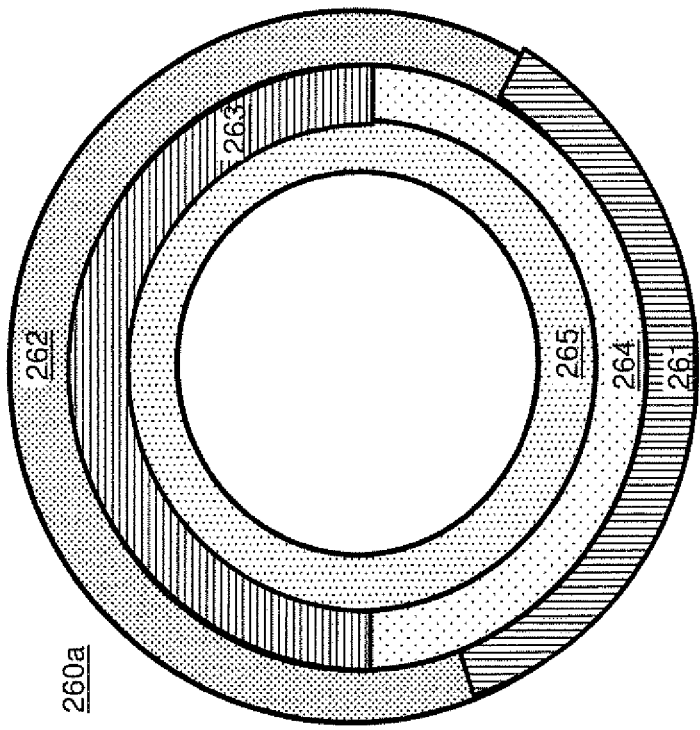
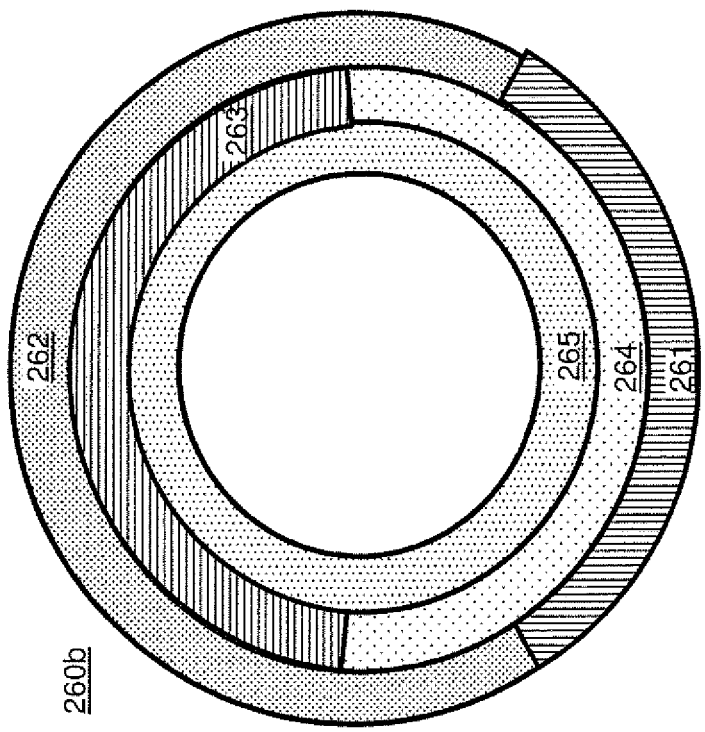
FIG. 2D

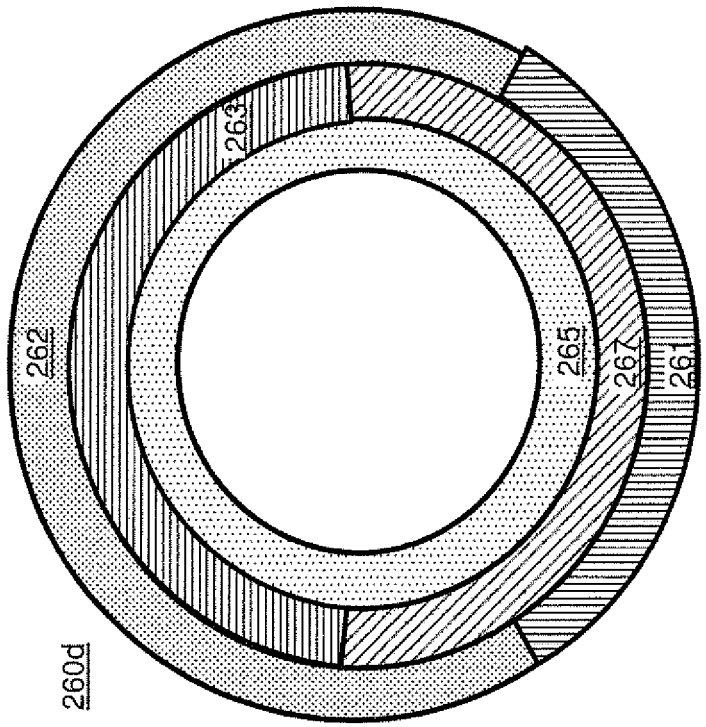
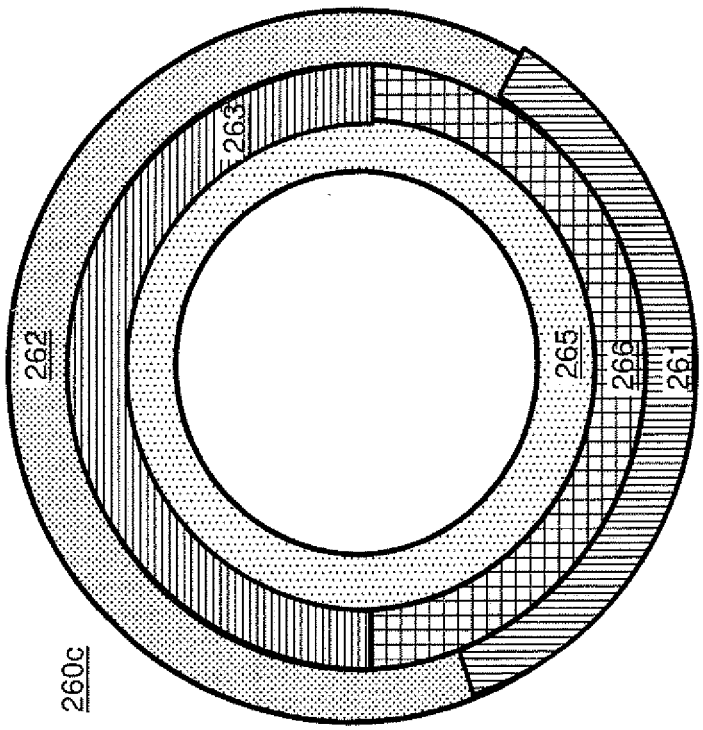
FIG. 2E

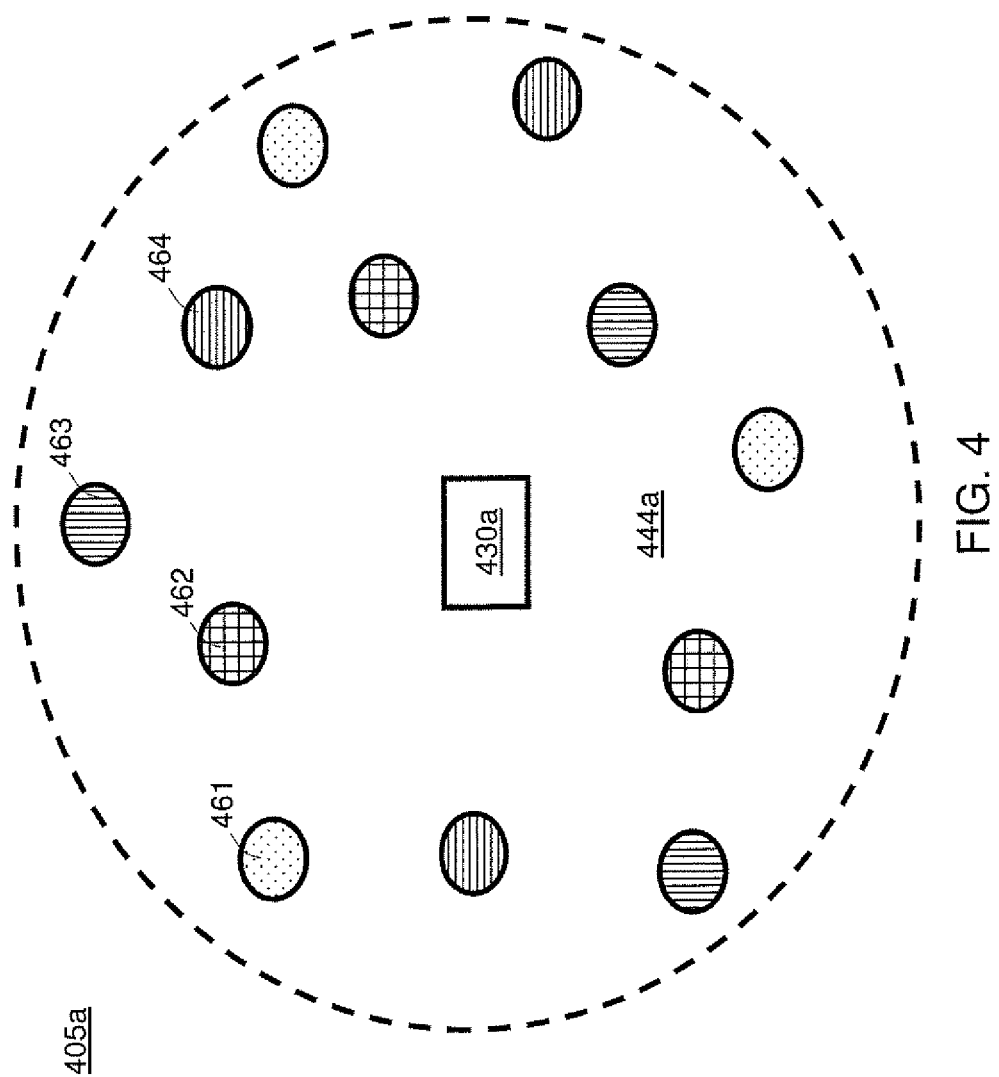

LIGHTING DEVICE WITH SPECTRAL CONVERTER

BACKGROUND

A light-emitting diode (referred to hereinafter as LED) represents one of the most popular light-emitting devices today. In recent years, the luminous efficacy of LEDs, defined in lumens per Watt, has increased significantly from 20 lumens per Watt (approximately the luminous efficacy of an incandescent light bulb) to over 500 lumens per Watt, which greatly exceeds the luminous efficacy of a fluorescent light at 60 lumens per Watt. In other words, for a fixed amount of light output, LEDs consume approximately one sixth of the power compared to fluorescent lights, and almost negligibly small compared to incandescent light bulbs. Accordingly, it is not surprising today that lighting fixtures with LEDs have recently been replacing incandescent light bulbs and fluorescent light tubes. A new term "Solid-State Lighting" has been created. The term "Solid-State Lighting" refers to the type of lighting that uses semiconductor light-emitting diodes, such as an LED rather than traditional light sources.

In the field of solid-state lighting, most of the light sources are white light. For LEDs, white light may be obtained by a method referred to as "RGB white". In this method, colored light emitted by LEDs, usually in primary colors such as red, green and blue light, is mixed to obtain white light. However, in some other solid-state lighting sources, white light may be obtained by other arrangements of one or more LEDs, which need not be colored LEDs.

Most light sources used in solid-state lighting may be further categorized by color temperature. The color temperature of a light source indicates the relative color appearance of the particular light source on a scale from "warmer" (more yellow/amber) to "cooler" (more blue) light. Color temperatures are generally given in Kelvin or K. Color temperatures over 5,000K are called cool colors (bluish white), while lower color temperatures (2,700-3,000 K) are called warm colors (yellowish white through red).

However, white light solid state light sources made from LEDs may be susceptible to process variation and other effects due to variation in manufacturing process. Color point of white light solid state light sources made from LEDs may be difficult to control and often the variation may be huge. The color point of the LEDs may vary substantially even using the same equipment and the same material. The variation may be to the extent that products produced at the same time using the same equipment are noticeably different in terms of color point and brightness.

Generally, one solution to the process variation issue may be by binning the products in accordance to the color temperature and the brightness of the LEDs so that products with similar brightness and color temperature can be separated and assembled together into lighting fixtures. The binning process may cause significant production yield loss, as the process variation may be huge. From lighting fixture manufacturer's perspective, the binning is not desirable. In order to fulfill the market needs of a wide range of color temperature ranging from warm white lighting fixtures to cool white lighting fixtures, lighting fixture manufacturers may have to manage significant inventories. For example, if the manufacturer uses 10 color bins, he may need to stock up to ten times inventories compared to ordinary manufacturing method without binning. The binning process may not be cost effective.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings are for illustrative purpose to assist understanding and may not be drawn per actual scale.

FIG. 1A shows an illustrative view of a system for illumination showing two lighting assemblies being configured to produce a substantially similar predetermined spectral output;

FIG. 1D illustrates a system of camera flash devices having the lighting assemblies shown in FIG. 1A;

FIG. 1E illustrates a system of lighting fixtures having the lighting assemblies shown in FIG. 1A;

FIG. 2D shows an illustrative view of the spectral converters for different light-emitting devices in FIG. 2A having substantially similar composition;

FIG. 2E shows an illustrative view of the spectral converters for different light-emitting devices in FIG. 2A having at least one different component;

FIG. 4 illustrates an alternative arrangement of the spectral converters shown in FIGS. 2D-2E;

DETAILED DESCRIPTION

Figure 1B:
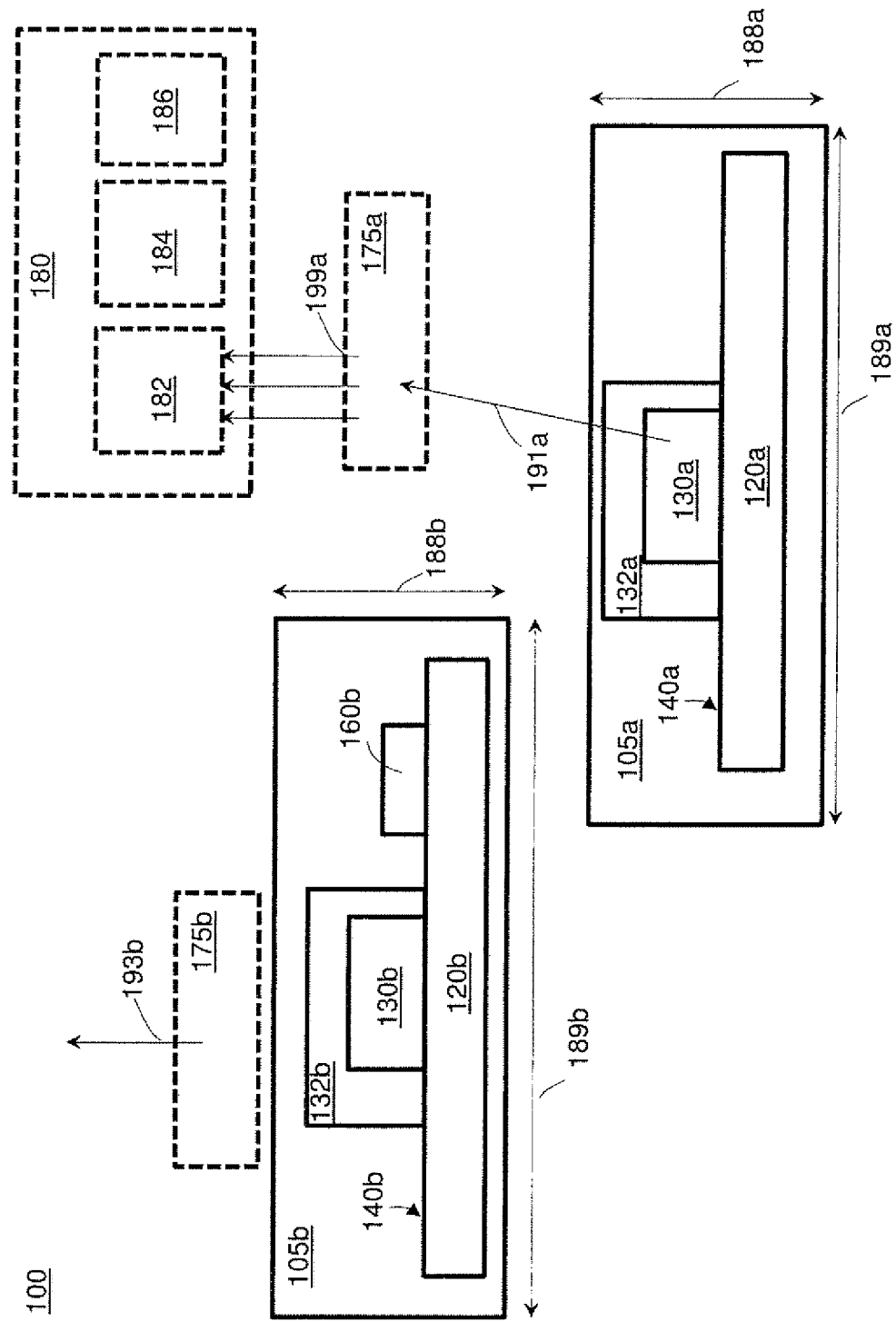
FIGS. 1B-1C show illustrative views how the lighting assemblies in the system shown in FIG. 1A are manufactured.

Light-emitting devices may be implemented using various packaging technologies such as a plastic leaded chip carrier (herein after PLCC) package, a ball grid array package (herein after BGA), a pin grid array package (herein after PGA), a quad flat pack (herein after QFP), a printed circuit board (herein after PCB) package and so on. Certain packages, for example PLCC packages, may comprise a lead frame over a molded polymer material such as Polyphthalamide (herein after PPA), Polyamide or Epoxy resin encapsulant like MG 97. For surface mount type, leads extending from the lead frame may be bent so that the light-emitting devices can be soldered on a substrate without through-holes. Light-emitting devices based on other packaging technologies such as a BGA and PGA may comprise a substrate having conductive traces without a lead frame.

The packaged LED may be used for various illumination purposes such as backlighting, camera flash, indicator light, solid-state lighting and other similar applications, where illumination may be desired. A lighting fixture on the other hand may be a lighting apparatus having packaged LED with additional reflectors or electric circuits for lighting purposes. Lighting fixtures with LED become more popular for mood lighting, wall lighting, artifact or ornament lighting, or other similar illumination purposes. In particular, for places such as factories, street lampposts, gas stations where the lighting fixtures may not be easily accessible, lighting fixtures with LED may be getting more popular.

Color temperature consistency may be desireable for lighting apparatuses. The color temperature consistency may be desired so that lighting apparatuses used side-by-side may produce substantially similar spectral output. FIG. 1A shows an illustrative view of a system 100 for illumination having a plurality of light-emitting assemblies 105a, 105b configured to produce a substantially similar predetermined spectral output. The plurality of light-emitting assemblies 105a, 105b shown in FIG. 1A may be lighting fixtures or lighting apparatuses used for solid-state lighting. Alternatively, the light-emitting assemblies 105a, 105b may be packaged LEDs used for any general illumination applications such as automotive lighting, camera flash devices, backlighting and other similar applications where light or illumination may be desired. The discussion about the lighting assemblies 105a, 105b may be applicable to light-emitting devices in packaged LED form or lighting fixtures having a LED, either in die form or in packaged form.

Each member of the lighting assemblies 105a, 105b may comprise a respective body or a substrate 120a, 120b, a respective light source die 130a, 130b and a respective spectral converter 160a, 160b. Source spectral output 194a, 194b of different light source dies 130a, 130b may be dissimilar due to process variation as discussed earlier. The source spectral output 194a, 194b may look dissimilar, especially when being compared side-by-side. In some cases, the source spectral output 194a, 194b may be noticeably different through human eyes even being compared by seeing the output 194a, 194b one after another. The respective spectral converter 160a, 160b may be selected to adjust a respective portion of the respective source spectral output 194a, 194b into a respective converted spectral output 195a, 195b. The source spectral outputs 194a, 194b and the converted spectral outputs 195a, 195b are depicted in FIG. 1A using dashed lines in spectral graphs showing horizontal spectral wavelength ("Lambda") axes and vertical spectral intensity ("I") axes.

Each of the plurality of lighting assemblies 105a, 105b may further comprise a respective reflector 140a, 140b coupled to the respective light source die 130a, 130b. The respective reflector 140a, 140b may be a portion of the substrate or the body 120a, 120b. In one embodiment, the respective reflector 140a, 140b where the light source die 130a, 130b is attached may be made highly reflective through coating of a layer of reflective material to define the reflector 140a, 140b. In another embodiment, the lighting assemblies 105a, 105b may be packaged LEDs with bodies 120a, 120b made from PPA that may be highly reflective to define the reflector 140a, 140b.

The respective spectral converter 160a, 160b may be formed on reflector 140a, 140b. The respective spectral converter 160a, 160b may be located adjacent to, but distanced from, the light source die 130a, 130b. This may be beneficial because by substantially avoiding direct contact with the light source dies 130a, 130b, the spectral converter 160a, 160b may be formed more uniformly and may be less susceptible to heat generated in the light source die 130a, 130b during operation.

The respective light source die 130a, 130b may be covered by a wavelength converting material 132a, 132b such as a phosphor. The light source dies 130a, 130b may have manufacturing process variances, so that the source spectral outputs 194a, 194b may be substantially different from one another. In particular, the light source dies may have manufacturing process variances, so that the source spectral outputs 194a, 194b may be sufficiently different from one another so that the difference may be at least noticeable by a user when the source spectral outputs are compared side-by-side. In the embodiment shown in FIG. 1A, the source spectral outputs 194a, 194b may have similar peak spectral components with intensity amplitudes that may be different from one another. While the graphs are noticeably different, the visual difference may be small and may be noticeable to trained eyes. On some occasions, the difference of the source spectral outputs 194a, 194b may not be visually noticeable unless the source spectral outputs 194a, 194b are compared side-by-side. In another embodiment, the difference of the source spectral outputs 194a, 194b may be noticeable through visual one-by-one comparison. Therefore, the source spectral outputs 194a, 194b and the converted spectral outputs 195a, 195b may be examined using a spectrometer to obtain spectral graphs rather than by naked human eyes for consistent comparison.

The respective assembly spectral output 199a, 199b of each member of the plurality of lighting assemblies 105a, 105b may be a respective spectral summation of the respective source spectral output 194a, 194b and the respective converted spectral output 195a, 195b. The assembly spectral outputs 199a, 199b are depicted in FIG. 1A using solid lines in spectral summation graphs, which show horizontal spectral wavelength ("Lambda") axes and vertical spectral intensity ("I") axes.

The converted spectral outputs 195a, 195b may have similar peak spectral components with intensity amplitudes that are substantially different from one another. As shown in FIG. 1A, the spectral converters 160a, 160b may be selected to adjust the portions of the source spectral outputs 194a, 194b differently, so that the spectral summations of the assembly spectral outputs 199a, 199b are substantially similar to one another. In some cases, the converted spectral outputs 195a, 195b from the lighting assemblies 105a, 105b may not be viewable individually or independently by a user.

For example, light rays 190a, 191a, 190b, 191b emitted from the light source dies 130a, 130b may be substantially different source spectral outputs 194a, 194b as illustrated in the spectral graphs shown in FIG. 1A. However, light rays 190a and 190b may be configured to transmit through spectral converters 160a and 160b respectively. Light rays 192a and 192b that are reflected and transmitted through the spectral converters 160a, 160b may have substantially different converted spectral outputs 195a, 195b as shown in FIG. 1A compared to the respective source spectral outputs 194a, 194b. Light ray 191a may be mixed with light ray 192a into the assembly spectral output 199a shown by light ray 193a. Similarly, light ray 199b may be mixed with light ray 192b into the assembly spectral output 199b shown by light ray 193b. The spectral converters 160a, 160b may be selected such that the plurality of lighting assemblies 105a, 105b may be configured to produce a substantially similar predetermined assembly spectral output 199a, 199b. Diffusers 175a, 175b may be employed such that the converted spectral outputs 195a, 195b represented by light rays 192a 192b may be mixed well with the source spectral outputs 194a, 194b represented by light rays 191a, 191b so as to provide the respective assembly spectral output 199a, 199b represented by light rays 193a, 193b.

Each of the spectral converters 160a, 160b may comprise a respective set of a respective plurality of different spectral converting materials 161a-163a, 161b-163b. Each of the spectral converting materials 161a-163a, 161b-163b may be made from substantially different phosphorescent materials, fluorescent materials, or color pigments. The spectral converting materials 161a-163a, 161b, 163b may also be any other similar materials that absorb light having a specific wavelength, or materials that may shift wavelength of a specific predetermined wavelength, or any combinations of the above. The spectral converters 160a, 160b may be selected to be different from one another, and may be selected to adjust the portions of the source spectral outputs 194a, 194b differently. One way to do this may be by using different compositions or amounts of spectral converting materials 161a,-163a, 161b-163b.

In the embodiment shown in FIG. 1A, each of the spectral converters 160a and 160b may have substantially similar spectral converting materials 161a-163a, 161b-163b but present in the sets in substantially different amounts. For example, the spectral converter 160a may comprise a first set of three spectral converting materials 161a-163a such as a yellow phosphor 161a, a red phosphor 162a, and a blue pigment 163a in ratios of 2:1:1. However, the spectral converter 160b may comprise a second set of spectral converting materials 161b-163b such as a yellow phosphor 161b, a red phosphor 161b, and a blue pigment 163b, which may be similar to the first set of three spectral converter materials, but which may be present in the second set in substantially different amounts than the first set, e.g. present in the second set with ratio of 2:3:1.

Each member of the plurality of lighting assemblies 105a, 105b may have a respective package having a respective form factor. The form factors may be substantially similar to one another. For example, the lighting assembly 105a may have a width dimension 189a, and a height dimension 188a whereas the lighting assembly 105b may have a width dimension 189b and a height dimension 188b as illustrated in FIG. 1B. The lighting assemblies 105a, 105b may be substantially congruent. In particular, the width dimension 188a and/or the height dimension 189a of the lighting assembly 105a may be substantially similar to the width dimension 189b and/or the height dimension 188b of the lighting assembly 105b. In another embodiment, the shape may be substantially similar but the actual size may differ by a constant multiplicant. A system of lighting assemblies 105a, 105b having substantially similar form factors or feature size may be manufactured using the same equipment and methodology to achieve the substantially similar assembly spectral outputs 199a, 199b.

Figure 1C:
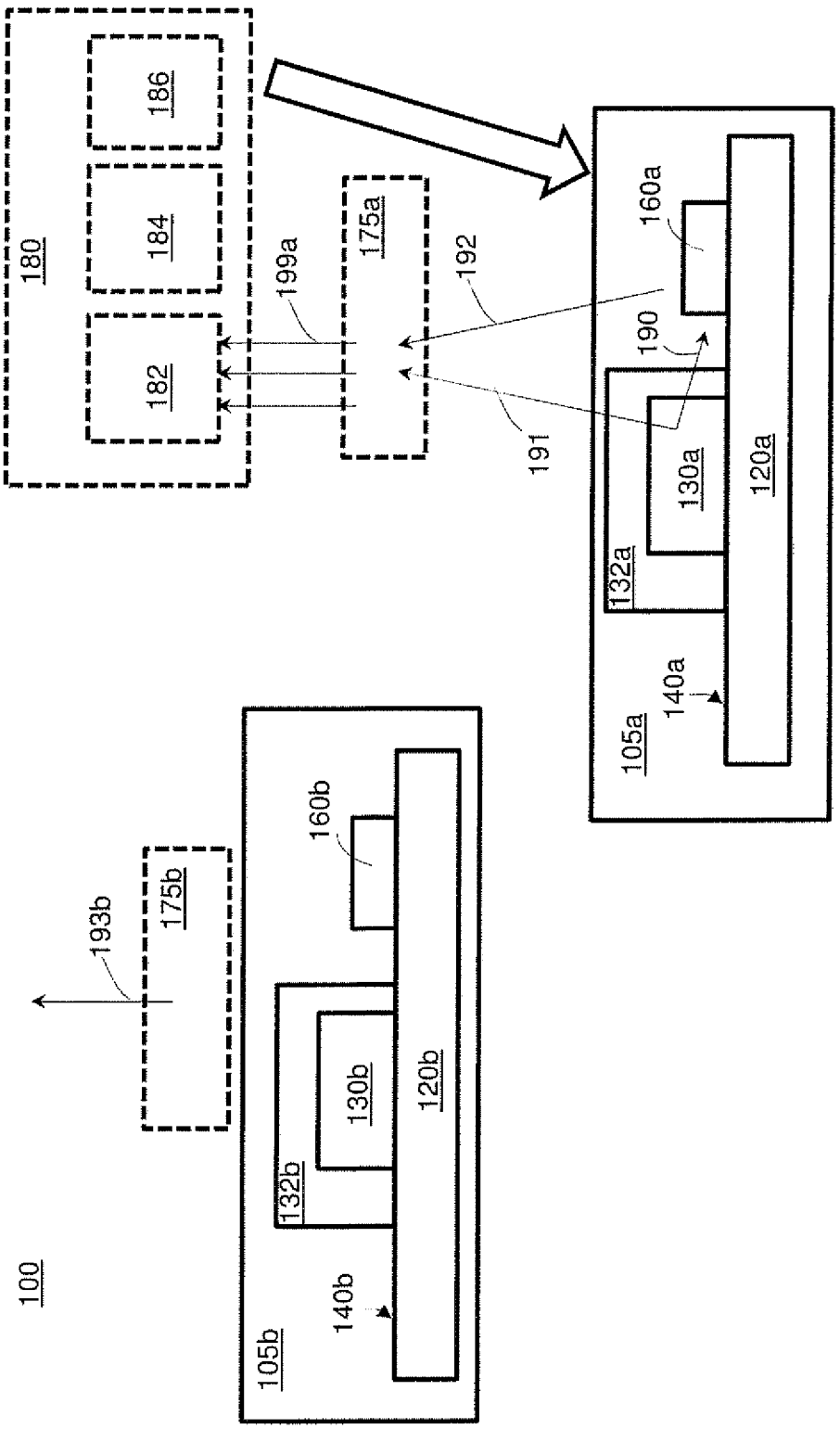

FIGS. 1B-1C are illustrative views showing how the lighting assemblies 105a, 105b in the system 100 in FIG. 1A may be made. The lighting assemblies 105a, 105b may be formed first without the spectral converter 160a, 160b as illustrated by the lighting assembly 105a in FIG. 1B prior to forming of the spectral converters 160a, 160b. The lighting assembly 105b shown in FIGS. 1B-1C is a completed product with the spectral converter 160b. The spectral converters 160a may be formed by first detecting the source spectral output 194a. For example, the lighting assembly 105a without the spectral converter 160a may be configured to produce light ray 191a such that the source spectral output 194a may be detected by a sensor 182 through the diffuser or a light mixer 175a as shown in FIG. 1B. A processor 184, for example, a suitably programmed microprocessor 184, may be employed to determine composition, types, and amount of respective spectral converting materials 161a-163a, which may be employed for the spectral converter 160a.

As shown in FIG. 1C, a dispenser 186 may be employed to form the spectral converter 160a onto the reflector 140a. After forming of the spectral converter 160a, the lighting assembly 105a may be configured to produce the assembly spectral output 199a. The assembly spectral output 199a may be a mixture of source spectral output 194a and converted spectral output 195a. The assembly spectral output 199a may be determined by the sensor 182a and the processor 184. The process may be repeated until the predetermined assembly spectral output 199a may be obtained.

The lighting assemblies 105a, 105b having substantially similar assembly spectral outputs 199a, 199b may be employed in camera flash devices 101a, 101b. FIG. 1D illustrates a system of camera flash devices having the lighting assemblies 105a, 105b shown in FIG. 1A. One advantage of having such similar outputs may be that the white balance and color computation of the camera chips may be made more consistent across different cameras. Without such consistency, the manufacturing of cameras may become more difficult in having to accommodate multiple computations for different cameras. Similarly, each member of the plurality of lighting assemblies 105a, 105b may form a portion of a lighting fixture 102a, 102b shown in FIG. 1E. Advantageously, the lighting fixtures 102a, 102b having substantially similar assembly spectral output 199a, 199b may be arranged side-by-side without the user noticing different color points.

Figure 2A:
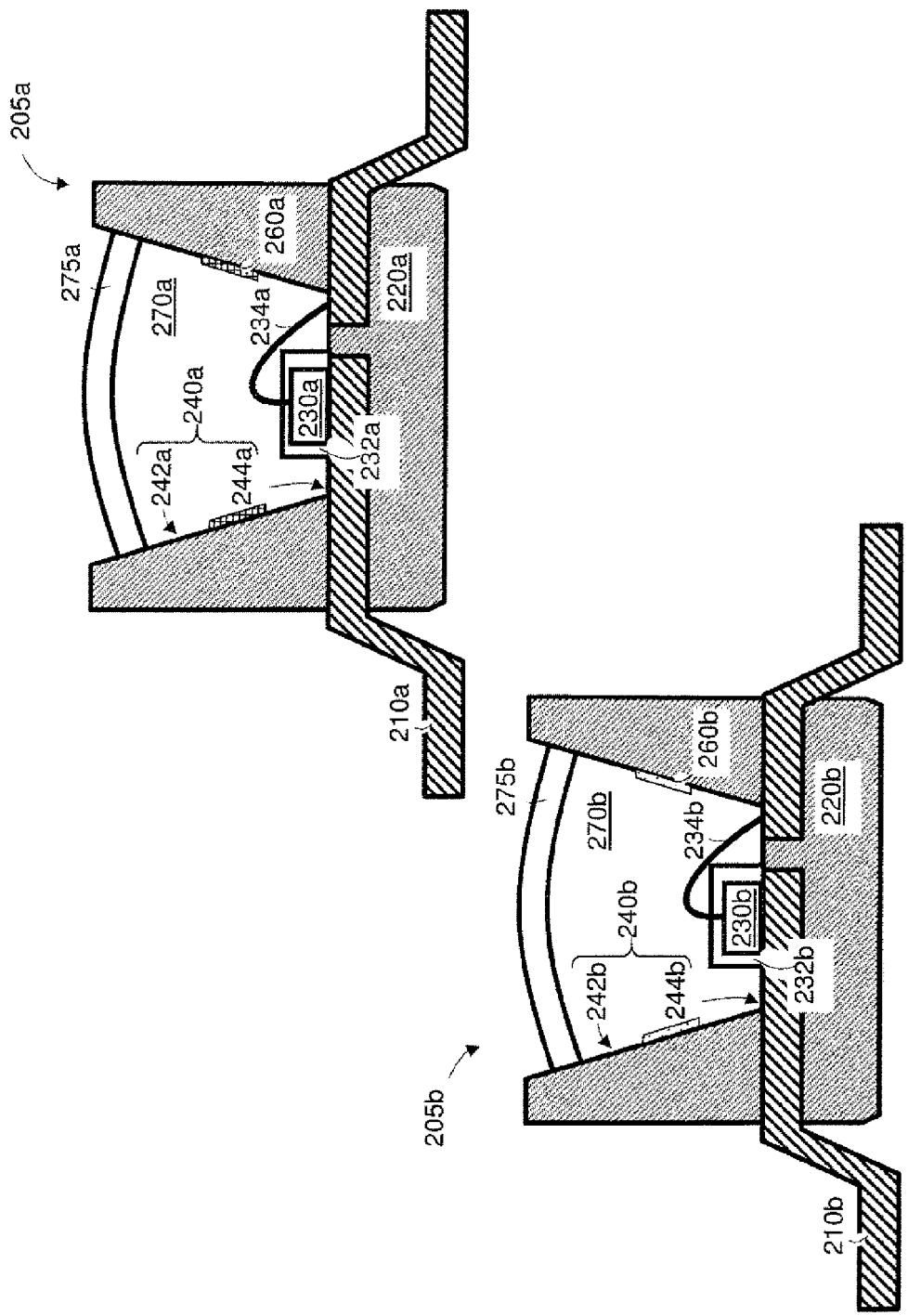
FIG. 2A illustrates a cross sectional view of two light-emitting devices having two different spectral converters.
Figure 2B:
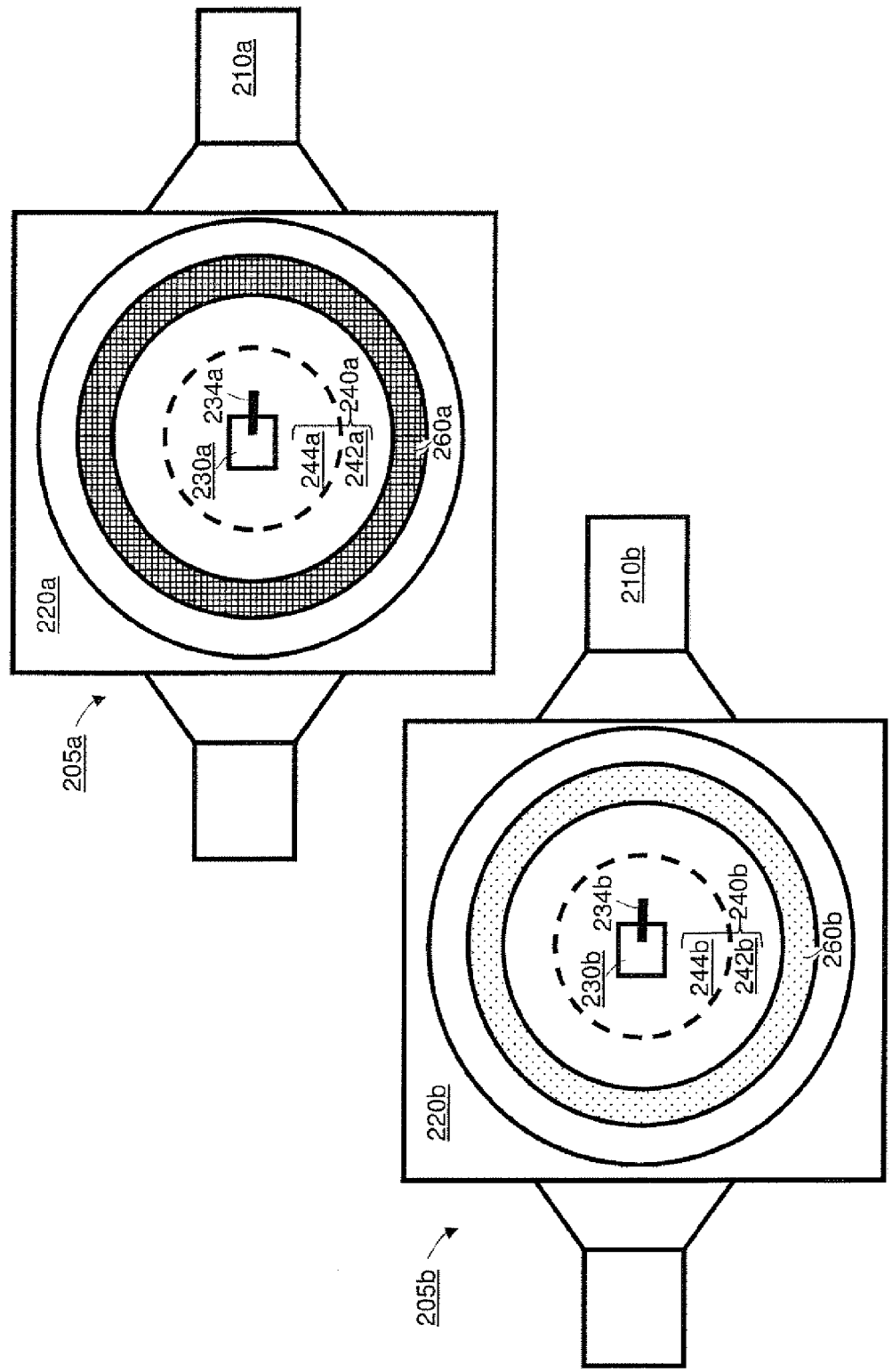
FIG. 2B illustrates a top view of the two light-emitting devices shown in FIG. 2A.

FIG. 2A illustrates a cross sectional view of two light-emitting devices 205a, 205b. A top view of the light-emitting devices 205a, 205b is shown in FIG. 2B. The two light-emitting devices 205a, 205b may form part of the system 100 shown in FIG. 1A. Referring to FIGS. 2A-2B, the light-emitting devices 205a, 205b may be configured to produce substantially similar output having a predetermined spectral content as illustrated in FIGS. 1A-1E. Each of the light-emitting devices 205a, 205b may comprise a plurality of conductors 210a, 210b, a body 220a, 220b, at least one reflective surface 240a, 240b, a light source die 230a, 230b, a spectral converter 260a, 260b, an encapsulant 270a, 270b, and an optional diffuser 275a, 275b.

"Conductors" 210a, 210b as used herein in reference to the light-emitting devices 205a, 205b refers to what can electrically connect the light-source dies 230a, 230b to external power sources (not shown). In PLCC packages, the plurality of conductors 210a, 210b may be leads forming part of lead frames but in other packaging technologies, for example printed circuit boards (referred hereinafter as "PCB"), the plurality of conductors 210a, 210b may be electrically conductive traces located on the PCBs. The scope of the invention should not be limited to any specific forms illustrated, but should be taken into consideration various other technologies, other forms of packaging either presently available, or developed in future. For example, the conductors 210a, 210b mentioned in the specification should include conductive traces used in PCB as well as leads used in a PLCC package.

In the embodiment shown in FIG. 2A, the plurality of conductors 210a, 210b may be made of electrically and thermally conductive material, such as steel, copper, metal or a metal alloy, a metal compound or other similar material. The plurality of conductors 210a, 210b may be formed using any conventional stamping, cutting, etching or other similar process that is known in the art. For surface mount purposes, the plurality of conductors 210a, 210b may be bent to define a bottom portion for attaching to external surfaces (not shown). A portion of the plurality of conductors 210a, 210b may be made larger and may form a portion of the reflective surface 240a, 240b.

Each "body" 220a, 220b as used herein in reference to a component of a light-emitting device 205a, 205b refers to a respective primary structure 220a, 220b, which provides structural support for other components of the light emitting device 205a, 205b. In another embodiment, the body 220a, 220b may be a substrate such as a PCB. Each body 220a, 220b may be a respective integral single piece structure 220a,

220*b*. The body 220*a*, 220*b* may be formed using an opaque material such as PPA, polyamide, epoxy resin, plastic and other similar material. The body 220*a*, 220*b* may be formed encapsulating or surrounding the plurality of conductors 210*a*, 210*b* using an injection molding process or other known process. Alternatively, the body 220*a*, 220*b* may be pre-formed and may be subsequently assembled to form the light-emitting device 205*a*, 205*b*.

The body 220*a*, 220*b* may be highly reflective, or coated with a reflective material. For example, a light-emitting device 205*a*, 205*b* having a white PPA may achieve reflectivity of more than 90%. The reflective surface 240*a*, 240*b* may comprise a portion of the body 220*a*, 220*b* that is made substantially flat and a portion of the conductors 210*a*. The reflective surface 240*a*, 240*b* may comprise a side reflective surface 242*a*, and a bottom reflective surface 244*a*, 244*b*. The light source die 230*a*, 230*b* may be mounted on a portion of one of the conductors 210*a*, 210*b*. The light source die 230*a*, 230*b* may be configured to generate light in response to applied drive current, and may be connected to an external power supply (not shown) through the conductors 210*a*, 210*b*. The light source die 230*a*, 230*b* may be an LED die, a laser diode die, or other light source capable of emitting light. The light source die 230*a*, 230*b* may comprise wavelength converting material 232*a*, 232*b* such as phosphor. In the embodiment shown in FIG. 2A, the light source die 230*a*, 230*b* may be a blue LED die and the wavelength converter 232*a*, 232*b* may be phosphor.

The light source die 230*a*, 230*b* may be connected to the plurality of conductors 210*a*, 210*b* through a wire bond 234*a*, 234*b*. The wire bond 234*a*, 234*b* may be a gold, copper or other similar wire bond material. The light source die 230*a*, 230*b* may be connected to the plurality of conductors 210*a*, 210*b* through solder balls using flip chip technology in another embodiment without any wire bonds. In yet another embodiment, other forms of electrical connection or combinations of wire bonds and solder balls may be used.

The encapsulant 270*a*, 270*b* may encapsulate the light source die 230*a*, 230*b*, at least a portion of the at least one reflective surface 240*a*, 240*b* and the spectral converter 260*a*, 260*b*. The optional diffuser 275*a*, 275*b* may be optically coupled to the encapsulant 270*a*, 270*b*. In one embodiment, the optional diffuser 275*a*, 275*b* may comprise structures positioned adjacent to the encapsulant 270*a*, 270*b* without being in direct contact. In other embodiments, the optional diffuser 275*a*, 275*b* may be glued on the encapsulant 270*a*, 270*b*. In yet another embodiment, the diffuser 275*a*, 275*b* may be a portion of encapsulant 270*a*, 270*b* that may be roughened to diffuse light. The encapsulant 270*a*, 270*b* may be silicone, epoxy or other substantially transparent material. The diffuser 275*a*, 275*b* may be configured to scatter light, so as to enhance light mixture after the light exit the encapsulant layer 270*a*, 270*b*.

As shown in FIG. 2A, the spectral converter 260*a*, 260*b* may be formed on the reflective surface 240*a*, 240*b* adjacent to, but distanced away from, the light source die 230*a*, 230*b*. The spectral converter 260*a*, 260*b* may be configured to substantially surround the spectral converter 260*a*, 260*b*. The spectral converter 260*a*, 260*b* may be configured to adjust the light emitted from the light source die 230*a*, 230*b* such that the light output of the light-emitting device 205*a*, 205*b* has a spectral content substantially similar to the predetermined spectral content. In the embodiment shown in FIG. 2A, the spectral converter 260*a*, 260*b* may be formed on the side reflective surface 242*a* but in another embodiment, the spectral converter 260*a*, 260*b* may be formed on the bottom reflective surface 244*a*, 244*b*. By substantially avoiding direct contact with the light source die 230*a*, 230*b*, the spectral converter 260*a*, 260*b* may be less susceptible to the heat generated by the light source die 230*a*, 230*b*. In addition, as the spectral converter 260*a*, 260*b* may be formed on the reflective surface 240*a*, 240*b*, the spectral converter 260*a*, 260*b* may be made more uniform and less susceptible to process variation.

Figure 2C:
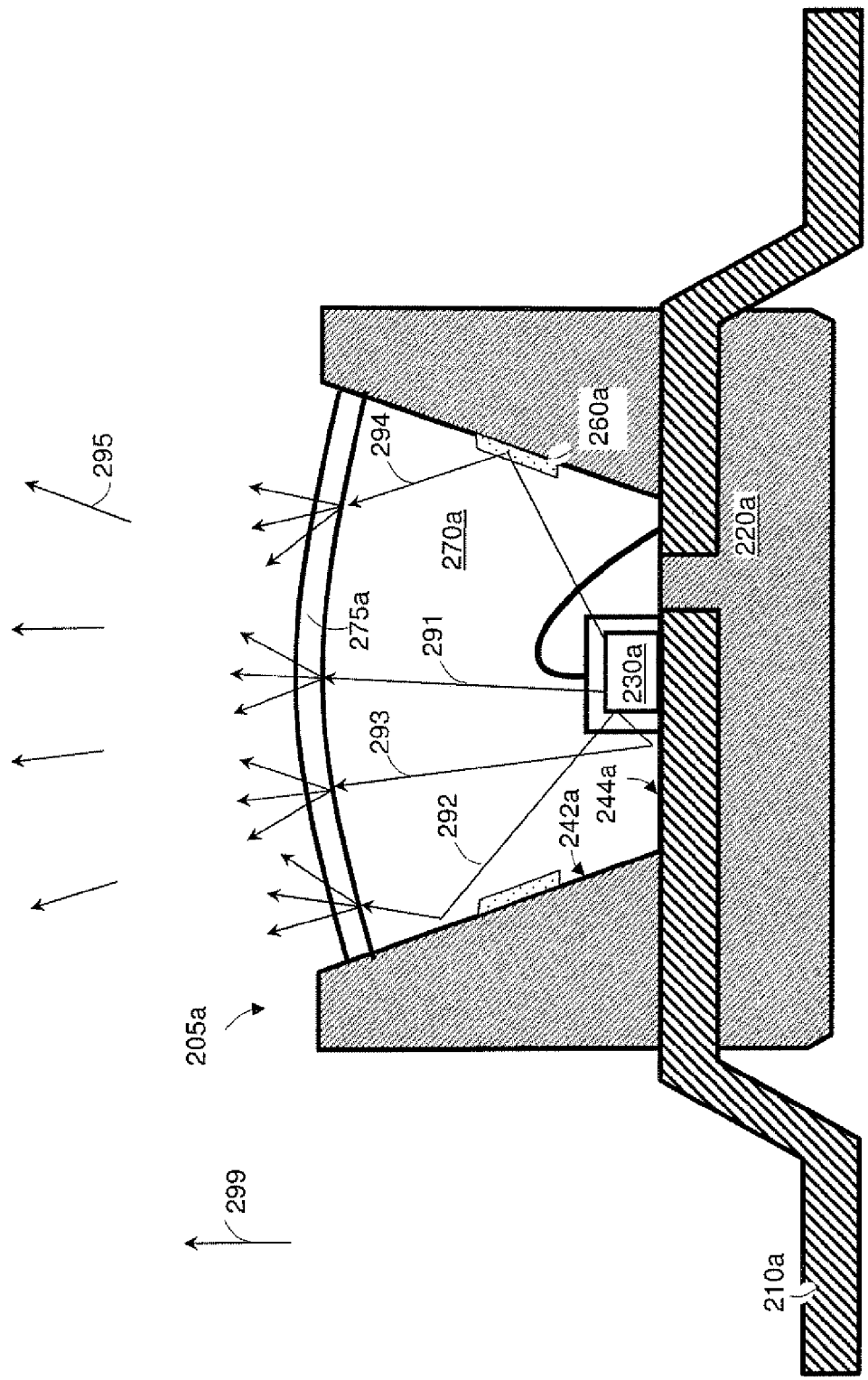
FIG. 2C illustrates how light rays are transmitted in the light-emitting device shown in FIG. 2A.

The bottom reflective surface 244*a*, 244*b* and the side reflective surface 242*a*, 242*b* may define a cup shape configured to direct light emitted from the light source dies 230*a*, 230*b* towards a predetermined direction 299 as shown in FIG. 2C. The spectral converter 260*a*, 260*b* may be distributed substantially evenly on a portion of the bottom reflective surface 244*a*, 244*b* or the side reflective surface 242*a*, 242*b*, or both of the above. In one embodiment, the spectral converter 260*a*, 260*b* may be formed on approximately 30% of the at least one reflective surface 240*a*, 240*b* so that a substantial portion of light may remain substantially unchanged. Being distributed evenly on a relatively smaller portion of the at least one reflective surface 240*a*, 240*b* may provide for the spectral converter 260*a*, 260*b* adjusting a portion of light emitted from the light source die 230*a*, 230*b*, which may be substantially less than the entire amount of light emitted from the light source die 230*a*, 230*b*.

For example, referring to FIG. 2C, light ray 291 may be directed towards the predetermined direction 299 in a direct manner. In contrast, light rays 292 and 293 may be directed towards the predetermined direction 299 in an indirect manner, after being reflected by each of the side and bottom reflective surfaces 242*a*, 244*a* respectively. Light rays 291-293 emitted by the light source die 230*a* may have the source spectral output 194*a* as discussed previously herein (See FIG. 1). On the other hand, light ray 294 is directed towards the predetermined direction 299 by the side reflective surface 242*a* after being transmitted through the spectral converter 260*a*. The spectral converter 260*a* may be configured to convert the source spectral output 194*a* into converted spectral output 195*a* as explained previously herein with reference to FIG. 1A. Light rays 291-294 may be optionally diffused in the diffuser 275 and mixed to form light ray 295. Accordingly, it should be understood that light ray 295 may be formed by mixing, and may have the assembly spectral output 199*a*, as explained previously herein with reference to FIG. 1A.

In one embodiment where substantially similar predetermined spectral output may be desired, the spectral converter 260*a* may be formed on less than approximately 30% of the at least one reflective surface 240*a*. Too much spectral converter 260*a* or uneven formation of spectral converter 260*a* may have adverse effect in achieving the substantially similar spectral output, as may be desired. The shape and area of the spectral converter 260*a* may have an impact on light uniformity. With formation of the spectral converter 260*a* being substantially uniform on a limited area or relatively smaller portion of the at least one reflective surface 240*a*, and being distanced away from the light source die 260*a*, the spectral converter 260*a* may be configured to adjust a portion of light to achieve the substantially similar spectral output, as may be desired.

The spectral converters 260*a*, 260*b* may comprise a plurality of spectral converting materials 261-265 as shown in FIGS. 2D-2E. In order to ease manufacturing effort, the plurality of spectral converting materials 261-265 may be arranged in a plurality of strips with each strip comprising a substantial quantity of one of the plurality of spectral converting materials 261-265. The strips may be substantially linear and the strips may be arranged in concentric curvatures surrounding the respective light source die 230*a*, 230*b* as shown in FIG. 2D-2E. In one embodiment, each strip of the spectral converting material 261-265 may be arranged in concentric rings as shown, for example, by the spectral converting material 265 in FIG. 2D. The light source dies 230a, 230b may be placed in the center of the rings.

The spectral converting materials 261-265 may be arranged in concentric manner for light uniformity purpose. However, concentric arrangement may be just an option and not a requirement. Lighting apparatuses or lighting fixtures where the lighting devices 205a, 205b can be incorporated may be distanced away from a user. In other embodiments, light may be mixed substantially evenly using alternative arrangements, without having the spectral converting materials 261-265 arranged in concentric manner.

As the light source dies 230a, 230b may have manufacturing process variances, the source spectral outputs 194a, 194b (See FIG. 1) may be substantially different from one another. In particular, the light source dies 230a, 230b may have manufacturing process variances, so that the source spectral outputs 194a, 194b may be sufficiently different from one another so that the difference may be at least noticeable by a user when the source spectral outputs are compared side-by-side. Correspondingly, each of the spectral converters 260a, 260b shown in the various figures may be formed differently to obtain the substantially similar predetermined output. For example, the spectral converter 260a, 260b may have similar composition of the spectral converting materials 261-265 shown in FIG. 2D, but each of the spectral converting materials 261-265 may be present in different amount so as to adjust the light differently. Furthermore, as shown in FIG. 2E, the sets of spectral converting materials 261-265 may be present in the spectral coverters 260c-260d with at least one different spectral converting material 266 or 267. Similarly, the spectral converters 260a-260d may be formed using different types of the spectral converting materials 261-267 that may be present in different amounts.

The spectral converting materials 261-267 may comprise at least one of a fluorescent material, a phosphorescent material and a color pigment. Each of the spectral converting materials 261-267 may be configured to generate a converted light of differing wavelength respectively. In addition, the spectral converting materials 261-267 may be configured to adjust a portion of the light predominantly with respect to a single color. For example, the spectral converting material 261 may be configured to adjust light having blue region wavelength whereas the spectral converting material 262 may be configured to adjust light having green region wavelength.

In the embodiment shown in FIG. 2E, one member of the spectral converting materials 261-267 may be configured to selectively shift a predetermined wavelength. For example, the spectral converting material 263 may be red phosphor configured to shift blue light into reddish white light. In addition, another member of the spectral converting material 261-267 may be configured to selectively reduce intensity of light having a specific wavelength. For example, the spectral converting material 264 may comprise blue color pigment configured to absorb blue light.

FIGS. 3A-3D illustrate source spectral outputs 398a-398d and assembly spectral outputs 399 of four different light-emitting devices. More particularly, FIGS. 3A-3D illustrate comparison of source spectral outputs 398a-398d converted into assembly spectral outputs 399, so as to provide the substantially predetermined spectral output 399 of lighting apparatuses such as lighting assemblies 105a, 105b, lighting fixtures 102a, 102b shown in FIGS. 1A-1E, or light-emitting devices 205a, 205b shown in FIGS. 2A-2E. The examples illustrated in FIGS. 3A-3D are non exhaustive and should not be narrowly interpreted.

Figure 3A:
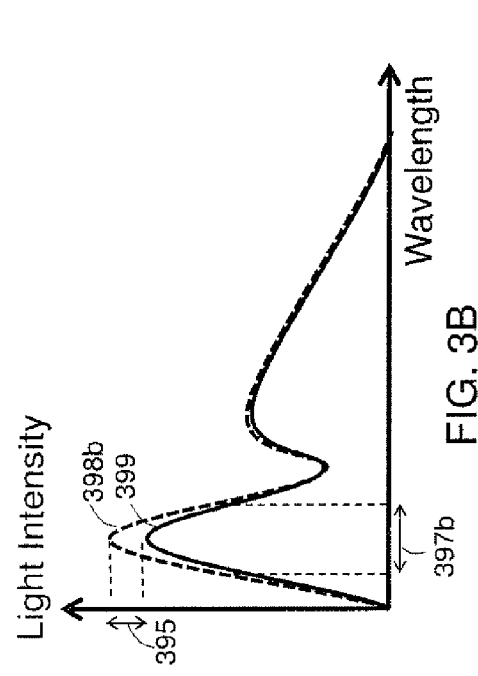
FIGS. 3A-3D illustrate source spectral outputs and assembly spectral outputs of four different light-emitting devices.
Figure 3B:
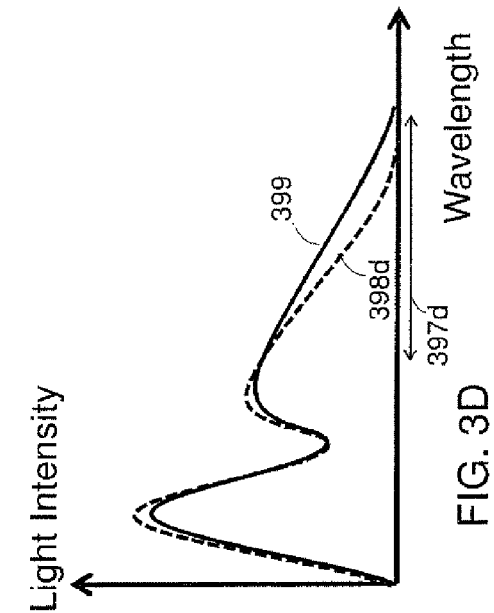
Figure 3C:
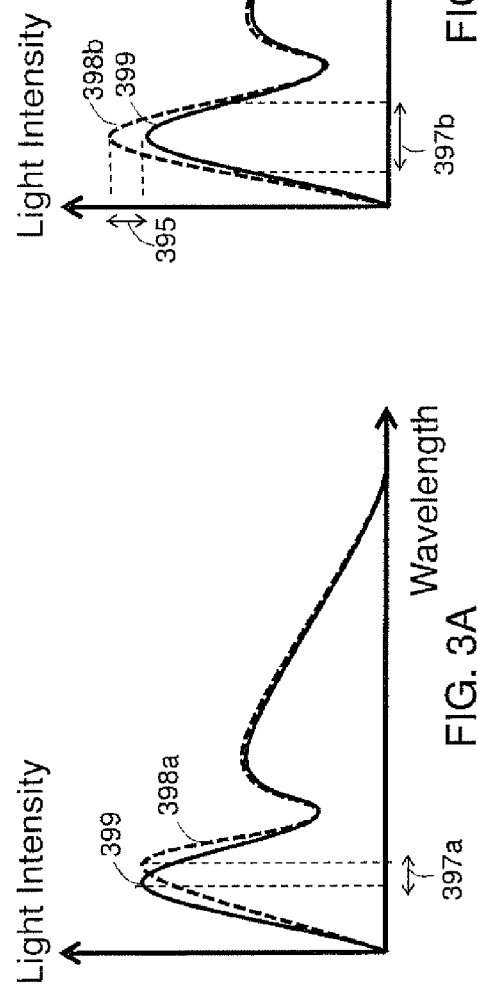
Figure 3D:
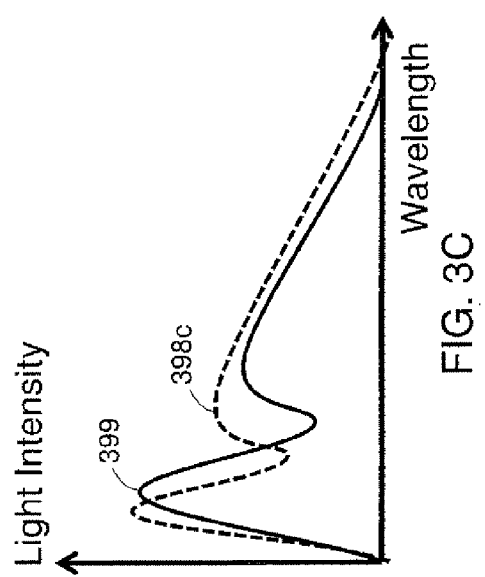

The spectral converters 160a, 160b or 260a, 260b shown in FIGS. 1A-2E may operate to shift peak wavelength of the source spectral output 398a by a specific and/or predetermined wavelength 397a as shown in FIG. 3A. In FIG. 3B, the spectral converters 160a, 160b or 260a, 260b may reduce amplitude 395 of specific and/or predetermined wavelengths 397b of the source spectral output 398b. Optionally, the above may be done in combination as shown in FIG. 3C that substantially all of the source spectral output 398c may be shifted and/or reduced by the spectral converters 160a, 160b or 260a, 260b. The example in FIG. 3D illustrates that a portion of the source spectral output 398d of a specific wavelength 397d may be boosted. As a result, the lighting apparatuses may be configured to produce the substantially similar predetermined spectral output 399.

FIG. 4 illustrates an alternative arrangement of the spectral converting materials 461-464. As shown in FIG. 4, the spectral converting materials 461-464 of the light-emitting device 405a may be arranged at a bottom reflective surface 444a. The bottom reflective surface 444a may be configured to receive the light source die 430a. While specific embodiments discussed previously herein showed spectral converting materials arranged in strips, other arrangements may be used. As shown in FIG. 4, the spectral converting materials 461-464 may be arranged in small clusters or in dots. For example, the spectral converting materials 461-464 may be formed in a plurality of substantially circular dots 461-464 that may be dispersed surrounding the light source die 430a. Each dot 461-464 may comprise substantially one type of the spectral converting materials 461-464 and/or may comprise a majority of one type of the spectral converting materials.

Figure 5:
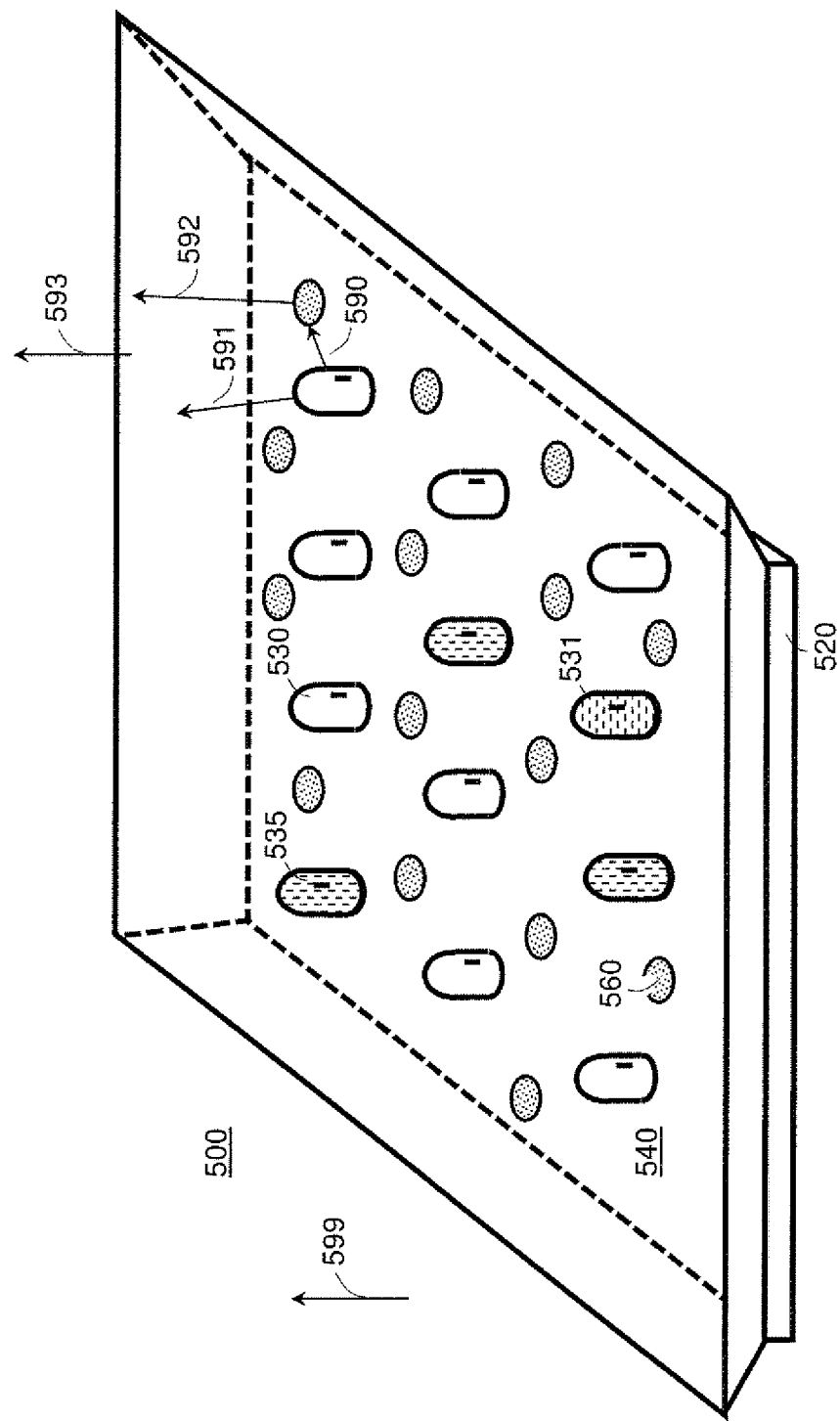
FIG. 5 illustrates a lighting apparatus having packaged LEDs and spectral converters.

FIG. 5 illustrates a lighting apparatus 500 having packaged LEDs. The lighting apparatus 500 may comprise a substrate or a body 520 and at least one light source 530 such as a packaged light-emitting device configured to emit white light. The at least one light source 530 may have a first color rendering index. The body 520 may comprise a reflective surface 540 for directing light emitted by the at least one light source 530 towards a predetermined direction 599. The at least one light source 530 may be coupled to the reflective surface 540. A portion of light such as light ray 591 may be directed directly towards the predetermined direction 599, but a portion of light such as light ray 590 may be directed towards the predetermined direction 599 through the reflective surface 540.

The lighting apparatus 500 may further comprise a spectral converter 560 formed on a portion of the reflective surface 540 adjacent to, but distanced away from, the at least one light source 530. The spectral converter 560 may be configured such that a portion of the light may be reflected through the spectral converter 560 towards the predetermined direction 599. For example light ray 590 may be reflected through the spectral converter 560 and may be spectrally adjusted therein into a second light ray 592. All the light rays 590-592 may be configured to intermix in the air to define the light output 593 of the lighting apparatus 500. The light output 593 of the lighting apparatus 500 may have a color rendering index that is substantially larger than the first color rendering index of the at least one light source 530.

Figure 6:
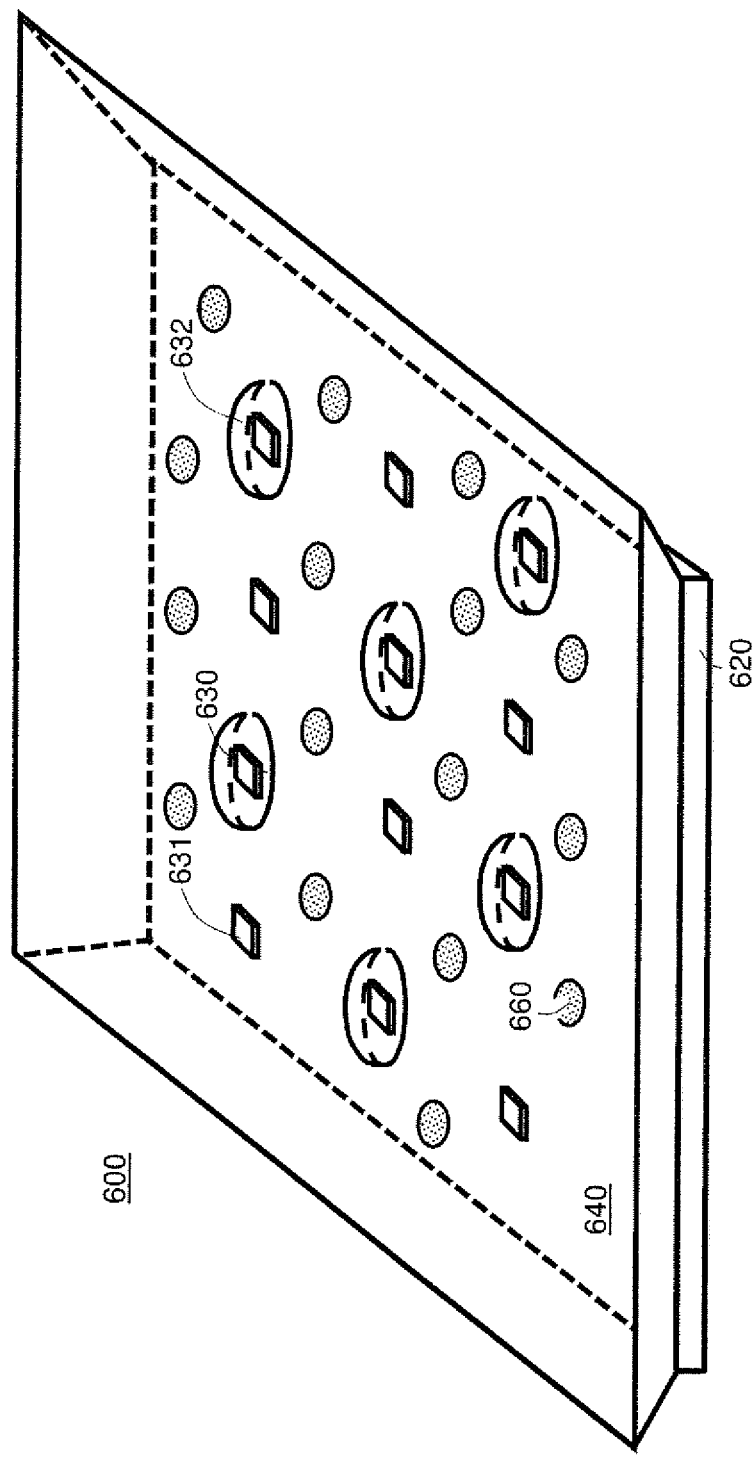
FIG. 6 illustrates a lighting apparatus having chip on board and spectral converters.

The lighting apparatus 500 may optionally comprise additional white light sources in addition to the at least one light source 530, and at least one additional white light source 531 having different color temperature. The lighting apparatus may also optionally comprise at least one colored light sources 535, such as red, green, blue, cyan, magenta, yellow or any color. Alternatively, the at least one light source 530 may be bare chip on board without packaging as shown in FIG. 6. FIG. 6 illustrates a lighting apparatus 600 having bare light source dies 630-631 being attached on a reflective surface 640. Some of the bare light source dies 630 may be encapsulated with phosphor 632 whereas some of the bare light source dies 631 may be left without phosphor encapsulation to produce white light. The lighting apparatus 600 may further comprise spectral converter 660 configured to increase color rendering index of the lighting apparatus 600 by spectrally adjusting a portion of the light output similar to previous embodiments.

Figure 7:
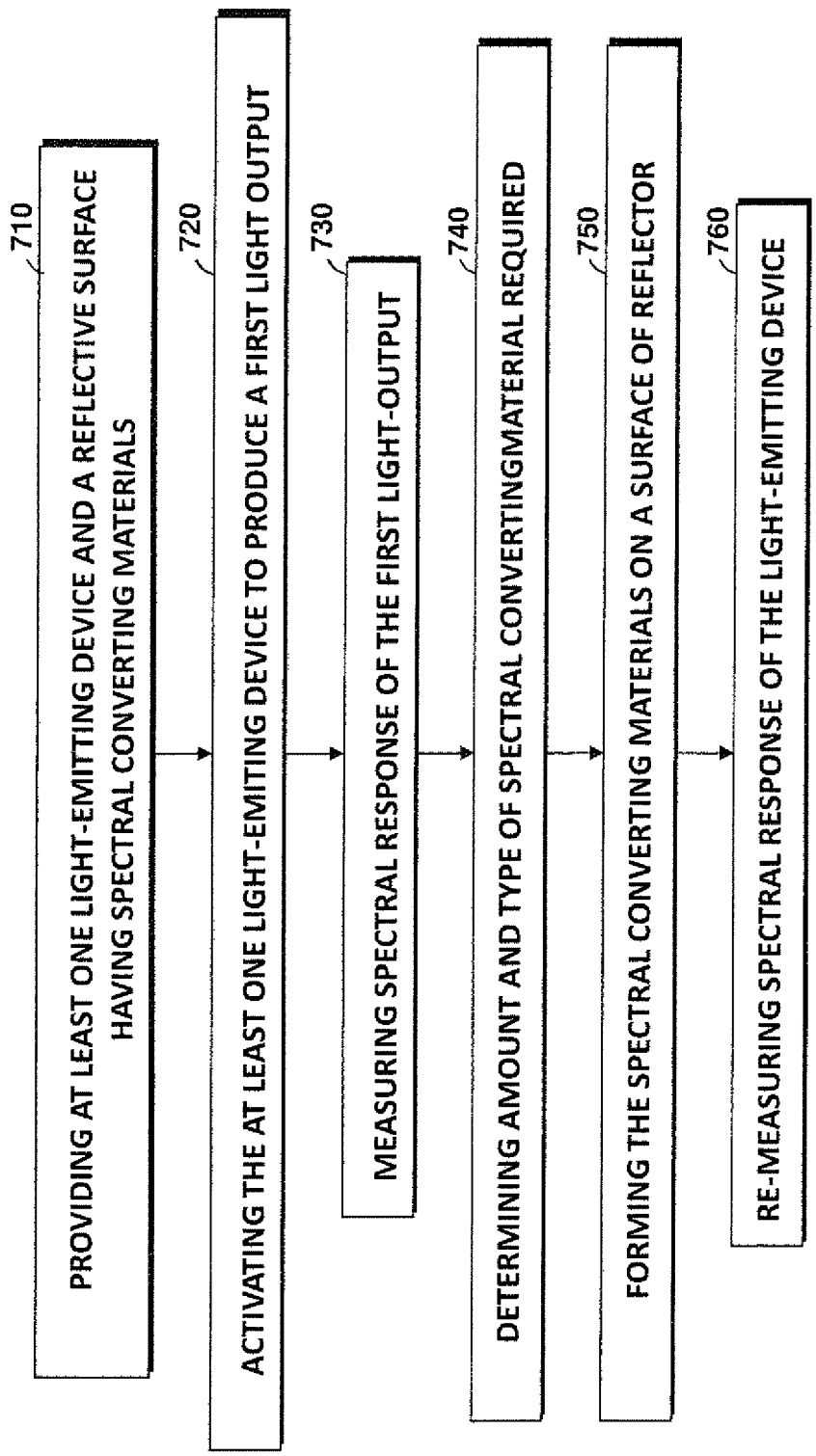
FIG. 7 illustrates a method for controlling multiple lighting apparatuses so that each of the multiple lighting apparatuses emits light having substantially the same color rendering index.

FIG. 7 illustrates a method for controlling multiple lighting apparatuses so that each of the multiple lighting apparatuses emits light having substantially the same color rendering index. In Step 710, at least one light-emitting device and a reflective surface having spectral converting materials may be provided. The at least one light-emitting device may be coupled to the reflective surface. Next, in Step 720, the at least one light-emitting device may be activated to produce a first light output. The spectral content of the first light output may be measured in the subsequent Step 730. The spectral content may be then compared to the predetermined spectral content in order to determine amount and/or type of the spectral converting materials desired in Step 740.

The method may then proceed to Step 750 in which the spectral converting material may be formed on at least a portion of the reflective surface in response to the amount of type of the spectral converting materials determined in Step 740. In Step 760, the spectral response of the lighting apparatus may be measured again to determine that desired spectral response has been achieved. Steps 740-760 may be repeated if necessary. Steps 710-760 may be repeated to manufacture additional lighting apparatuses. As the spectral responses of all the lighting apparatuses may be substantially similar, color rendering indexes of all the lighting apparatuses may be substantially the similar.

Different aspects, embodiments or implementations may, but need not, yield one or more of the following advantages. For example, the area and shapes of the spectral converting material may improve color uniformity. Another advantage may be that the amount and type of spectral converting material used may increase color rendering index.

Although specific embodiments of the invention have been described and illustrated herein above, the invention should not be limited to any specific forms or arrangements of parts so described and illustrated. For example, light source die described above may be LEDs die or some other future light source die as known or later developed without departing from the spirit of the invention. Likewise, although light-emitting devices were discussed, the embodiments are applicable to lighting fixtures as well as component level such as a light-source packaging to produce the light-emitting devices. The scope of the invention is to be defined by the claims appended hereto and their equivalents.

What is claimed is:

1. A system for illumination comprising:
   a plurality of lighting assemblies having substantially similar assembly spectral outputs;
   each member of the plurality of lighting assemblies comprising a respective light source die having a respective source spectral output, and a respective spectral converter selected to adjust a respective portion of the respective source spectral output into a respective converted spectral output;
   wherein the spectral converters are selected to be different from one another, and are selected to adjust the portions of the source spectral outputs differently; and
   wherein the respective source spectral output of each member of the plurality of lighting assemblies is mixed with the respective converted spectral output to provide the respective assembly spectral output.

2. A system as recited in claim 1 wherein:
   the respective assembly spectral output of each member of the plurality of lighting assemblies is a respective spectral summation of the respective source spectral output and the respective converted spectral output; and
   the spectral converters are selected to adjust the portions of the source spectral outputs differently, so that the spectral summations of the assembly spectral outputs are substantially similar to one another.

3. A system as recited in claim 1 wherein each of the plurality of lighting assemblies further comprises a respective reflector arranged adjacent to the respective light source die.

4. A system as recited in claim 3 wherein the respective spectral converter is formed on the reflector and located adjacent to, but distanced from, the light source die.

5. A system as recited in claim 1 wherein each of the spectral converters comprises a respective set of a respective plurality of different spectral converting materials.

6. A system as recited in claim 5 wherein one of the corresponding members of spectral converting materials comprises a color pigment that is present in the sets in substantially different amounts.

7. A system as recited in claim 1, wherein each member of the plurality of lighting assemblies forms a portion of a camera flash.

8. A light-emitting device configured to produce a light output having a predetermined spectral content, comprising:
   a body;
   at least one reflective surface of the body;
   a light source die attached on the at least one reflective surface, the light source die being configured to emit light; and
   a spectral converter formed on the at least one reflective surface adjacent to but distanced away and substantially surrounding the light source die,
   wherein the spectral converter is configured to adjust the light emitted from the light source die such that the light output of the light-emitting device has a spectral content substantially similar to the predetermined spectral content.

9. A light-emitting device as recited in claim 8 wherein the spectral converter comprises a plurality of spectral converting materials, and each member of the plurality of spectral converting materials is configured to generate converted light of differing wavelengths respectively.

10. A light-emitting device as recited in claim 9 wherein one member of the plurality of spectral converting materials is configured to selectively shift a predetermined wavelength of light.

11. A light-emitting device as recited in claim 9 wherein one member of the plurality of spectral converting materials is configured to selectively reduce intensity of light having a predetermined wavelength.

12. A light-emitting device as recited in claim 9 wherein each of the plurality of spectral converting materials is configured to adjust a portion of the light predominantly with respect to a single color.

13. A light-emitting device as recited in claim 9 wherein:
   the plurality of spectral converting material are arranged in a plurality of strips; and each strip comprises in substantial quantity of one of the plurality of spectral converting materials.

14. A light-emitting device as recited in claim 13, wherein the plurality of strips are arranged in concentric curvatures.

15. A light-emitting device as recited in claim 13, wherein the plurality of strips are arranged in concentric rings.

16. A light-emitting device as recited in claim 9 wherein each member of the spectral converting materials comprises at least one of a fluorescent material, a phosphorescent material and a color pigment.

17. A light-emitting device as recited in claim 8 wherein the spectral converter is distributed substantially evenly on a portion of the at least one reflective surface.

18. A lighting apparatus configured to produce a light output, comprising:
   a body;
   a reflective surface of the body;
   at least one light source coupled to the reflective surface, the at least one light source being configured to emit a first light ray having a first color rendering index; and
   a spectral converter formed on a portion of the reflective surface adjacent to the at least one light source and configured such that a portion of the first light ray that is reflected through the spectral converter is spectrally adjusted into a second light ray;
   wherein the reflective surface and the spectral converter are configured to intermix the first and second light rays and to direct the first and second light rays towards a predetermined direction, so as to provide the light output of the lighting apparatus,
   wherein the light output of the lighting apparatus has a second color rendering index that is substantially larger than the first color rendering index of the first light ray of the at least one light source.

19. The lighting apparatus of claim 18, wherein the at least one light source comprises at least one package light-emitting device configured to produce white light.

20. The lighting apparatus of claim 18, wherein the at least one light source further comprises at least one package light-emitting device configured to produce light of substantially one color selected from red, green, blue, cyan, magenta and yellow.

* * * * *